United States Patent
Tochio

(10) Patent No.: US 7,158,551 B2
(45) Date of Patent: Jan. 2, 2007

(54) DRIVER CIRCUIT AND DRIVING METHOD FOR SEMICONDUCTOR LASER

(75) Inventor: Yuji Tochio, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/015,616

(22) Filed: Dec. 17, 2001

(65) Prior Publication Data

US 2002/0075919 A1    Jun. 20, 2002

Related U.S. Application Data

(63) Continuation of application No. PCT/JP99/04190, filed on Aug. 3, 1999.

(51) Int. Cl.
*H01S 3/13*    (2006.01)
*H01S 3/00*    (2006.01)

(52) U.S. Cl. .............................. 372/38.02; 372/29.015; 372/38.07

(58) Field of Classification Search .... 372/38.1–38.09, 372/26, 25
See application file for complete search history.

(56) References Cited

U.S. PATENT DOCUMENTS

| | | | | |
|---|---|---|---|---|
| 4,292,606 A | * | 9/1981 | Trimmel | 332/7.51 |
| 4,339,822 A | * | 7/1982 | Kolodzey | 372/26 |
| 4,558,465 A | * | 12/1985 | Siegel | 455/609 |
| 6,370,175 B1 | * | 4/2002 | Ikeda et al. | 372/38.1 |

FOREIGN PATENT DOCUMENTS

| | | |
|---|---|---|
| JP | 61-80922 | 4/1986 |
| JP | 61-131631 | 6/1986 |
| JP | 61131631 | 6/1986 |
| JP | 4-281633 | 10/1992 |
| JP | 04281633 | 10/1992 |
| JP | 9-83050 | 3/1997 |
| JP | 09083050 | 3/1997 |
| JP | 10-284791 | 10/1998 |
| JP | 10284791 | 10/1998 |
| JP | 11-17625 | 1/1999 |
| JP | 11017625 | 1/1999 |

OTHER PUBLICATIONS

EP Search Report for corresponding application No. 99933257.0-2222 dated Aug. 12, 2005.

* cited by examiner

*Primary Examiner*—Armando Rodriguez
(74) *Attorney, Agent, or Firm*—Staas & Halsey LLP

(57) ABSTRACT

A driver circuit for a semiconductor laser of the invention comprises: first bias current supply means for supplying, at least at a time of non-output of data, a first bias current to an LD; signal processing means for generating a pulse current control signal in which a burst data signal is delayed, and generating a second bias current control signal which rises more rapidly by a predetermined time than the rise of burst data included in the pulse current control signal; pulse current supply means for supplying to the LD a pulse current generated in accordance with the pulse current control signal; and second bias current supply means for supplying to the LD a second bias current generated in accordance with the second bias current control signal.

16 Claims, 14 Drawing Sheets

DRIVER CIRCUIT AND DRIVING METHOD FOR SEMICONDUCTOR LASER

This application is a continuation of PCT/JP99/04190 filed on Aug. 3, 1999.

TECHNICAL FIELD

The present invention relates to a driver circuit and a driving method for a semiconductor laser, and in particular relates to a driver circuit and a driving method for a semiconductor laser suitable for when burst transmission is performed,.

BACKGROUND ART

Recently, optical communication networks utilizing the broadband characteristics of an optical fiber are gaining attention. For example, optical access networks where optical fibers are laid for each house as with FTTH (Fiber To The Home), for supplying multi-media services such as CATV or VOD are gaining considerable attention.

FIG. 1 shows a construction of an ATM-PON (Passive Optical Network) that has gained attention as one of systems for realizing an optical access network.

In FIG. 1, the ATM-PON has a basic structure where a plurality of subscriber side apparatus #1–#n are connected via an optical coupler to a single station side apparatus connected to an ATM network. In such an ATM-PON, in a case where data (upstream data) is transmitted from each of the subscriber sides to the station side, a burst transmission technique is required. For this burst transmission technique, in the transmission section of each of the subscriber side apparatus, as well as requiring a high extinction ratio compared to the conventional trunk line system, preferably the "0" level optical output is as close as possible to non emission.

More specifically, as shown for example in FIG. 2A, for respective optical outputs D1–D3 after being respectively transmitted from the subscriber side apparatus #1–#3 and multiplexed by the optical coupler, the minimum value L1min of the "1" level (in the figure, the "1" level of optical output D2) in all of the optical outputs D1–D3 must exceed the maximum value L0max of the "0" level (in the figure, the "0" level of the optical output D3), and the minimum value L1min of the "1" level must not become less than the maximum value L0max of the "0" level as shown in FIG. 2B.

For the conventional driving method of a semiconductor laser (LD) on the subscriber side, for example, as shown by the current-light output (I-L) characteristic for a LD in FIG. 3, there is a method where in all of the subscriber side apparatus, the LD current of the "0" level is set to 0 mA, or to a system allowable minute current.

Furthermore, in a driving method described for example in Japanese Unexamined Patent Publication No. 61-80922, there is disclosed a method where, as shown by the I-L characteristic in FIG. 4, a bias current is supplied to the LD immediately before and immediately after an occurrence of optical output of the "1" level. Moreover, in the driving method described for example in Japanese Unexamined Patent Publication No. 9-83050 filed by the present applicant prior to the present invention, there is disclosed a method where, as shown in FIG. 5, a bias current is supplied to the LD only in a period immediately before transmission of burst data (for example, a fixed length cell packet) and during the transmission. Such a driving method adopts a so-called pre-bias method where the bias current is supplied according to the transmission period of the burst data, and in the non-transmission period, the bias current supply is not performed.

In addition, in the driving method described for example in Japanese Unexamined Patent Publication No. 61-131631, there is disclosed a method which, in order to shorten the drive time for the LD at the time of starting burst data transmission, supplies a minute fixed bias current to the LD also in the data non-transmission period, and uses the abovementioned pre-bias current and fixed bias current together.

However, in the abovementioned known driving methods, there are the following problems.

In the driving method shown in FIG. 3, if an oscillation delay time of the LD is considered, there is a possibility that this method cannot cope with a high transmission speed. In the current situation, it is a limit for this method to cope with a transmission speed of around 100~200 Mb/s.

Furthermore, in the driving method shown in FIG. 4, the higher the transmission speed becomes, the more difficult it becomes to accurately and reliably supply the pre-bias current immediately before and immediately after generating an optical output of "1" level. More specifically, the realization of a circuit or the like for determining the timing for the pre-bias current is difficult.

Moreover, in the driving method shown in FIG. 5, there is a possibility that the start-up time at the time of starting the supply of pre-bias current causes a problem. Unless the start-up is performed at a high speed, this method becomes equivalent to the driving method shown in FIG. 3, and an effect of this driving method cannot be sufficiently obtained. For example, it is considered that if a large capacity LD is used, the start-up at a high speed will be difficult.

In addition, in the driving method that uses the pre-bias current and the fixed bias current together, it is likely that the time required when converting from the pre-bias current to the fixed bias current after transmission of burst data, will cause a problem. More specifically, as with the description in the abovementioned publications, if the change of the bias current is to be realized by discharge of a capacitor, then in the case where the transmission speed is a high speed, there is a possibility that the change of the bias current is not converged to within 1 bit of data. Furthermore, it is necessary to apply from outside a signal (for example, an enable signal or the like accompanied the burst data) for judging the transmission period and the non-transmission period of the burst data. Therefore, there is also the drawback that it is difficult to flexibly cope with the various transmission systems.

SUMMARY OF THE INVENTION

The present invention addresses the above mentioned points, with the object of providing a driver circuit and a driving method for a semiconductor laser which can transmit burst data at a high speed and reliably,.

DISCLOSURE OF THE INVENTION

Therefore, a driver circuit for a semiconductor laser of the present invention, for driving a semiconductor laser in accordance with a data signal including data generated in bursts, comprises; first bias current supply means for generating, at least at a time of non-output of data, a first bias current for driving the semiconductor laser in a predetermined area within a spontaneous emission area, to supply the first bias current to the semiconductor laser; signal processing means for generating a pulse current control signal in which the data signal is delayed, using only the data signal, and generating a second bias current control signal that rises more rapidly by a predetermined time than the rise of burst data included in the pulse current control signal; pulse current supply means for generating a pulse current in accordance with the pulse current control signal generated in the signal processing means, to supply the pulse current to the semiconductor laser; and second bias current supply means for generating a second bias current for driving the semiconductor laser in a predetermined area within the spontaneous emission area in accordance with the second bias current control signal generated in the signal processing means, to supply the second bias current to the semiconductor laser.

With such a construction, the first bias current is supplied to the semiconductor laser at least at the time of non-output of data. Moreover, the second bias current is supplied immediately before the data transmission, and the semiconductor laser is driven in the spontaneous emission area in preparation in the burst data output. Then, once a predetermined time after commencement of supply of the second bias current has elapsed, the pulse current is supplied to the semiconductor laser, and a burst optical signal corresponding to the data signal is output from the semiconductor laser. As a result, an optical output waveform of the semiconductor laser reliably rises, without deterioration of the waveform due to oscillation delay and the like, from a head waveform of the burst data. Hence the high-speed output of burst data can be reliably performed. Furthermore, the supply timing for the first bias current and the pulse current is determined based only on the data signal, so that it is not necessary to apply a signal from outside showing an output state of the burst data. Therefore, it is possible to flexibly cope with various transmission systems.

Moreover, in the abovementioned driver circuit for a semiconductor laser, preferably the first bias current supply means includes a temperature compensation section for changing the first bias current corresponding to characteristic changes in the semiconductor laser due to temperature changes. More specifically, the temperature compensation section may have a thermistor with a resistance value being changed with temperature fluctuations.

With such a construction, the first bias current is changed following the temperature characteristics of the semiconductor laser. Therefore, the output of burst data can be more accurately performed.

Moreover, the abovementioned driver circuit for a semiconductor laser may comprise: optical output detection means for detecting the power of light output from the semiconductor laser, and first bias current control means for feedback controlling an operation of the first bias current supply means so that the optical output power from the semiconductor laser at the time of non-output of data becomes a constant level, based on a detection result of the optical output detection means.

With such a construction, at the time of non-output of data, the first bias current is feedback controlled so that a so-called APC (Automatic Power Control) is executed. As a result, it becomes possible to even more reliably perform the output of burst data.

Furthermore, in the abovementioned driver circuit for a semiconductor laser, the second bias current supply means may have a differential amplification type circuit structure.

By having such a circuit structure, the times necessary for rising and falling of the second bias current are shortened. Therefore, it is possible to cope with even higher speed burst data transmission.

Moreover, it is preferable that the second bias current supply means includes a temperature compensation section for changing the second bias current corresponding to characteristic changes in the semiconductor laser due to temperature changes. More specifically, the temperature compensation section may have a thermistor with a resistance value being changed with temperature fluctuations.

With such a construction, the second bias current is changed following the temperature characteristics of the semiconductor laser. Therefore, the output of burst data can be more accurately performed.

Furthermore, in a specific construction for the abovementioned driver circuit for a semiconductor laser, the signal processing means may generate the second bias current control signal which rises more rapidly, by a time corresponding to a predetermined bit number or a predetermined byte number, than the rise of burst data included in the pulse current control signal. Moreover, the signal processing means may generate the second bias current control signal which is maintained at a high level over at least a predetermined period of the beginning side of the burst data generation period. In addition, the first bias current supply means may have a circuit structure the same as for the second bias current control means, and may generate the second bias current in accordance with a signal obtained by inverting the second bias current control signal generated by the signal processing section.

Furthermore, in the above mentioned driver circuit for a semiconductor laser, when a rise time of the second bias current is shorter than a time corresponding to 1 bit length of burst data, the signal processing means may comprise a delay section for delaying the data signal by a predetermined time, and a logical sum operation section for obtaining a logical sum of an output signal from the delay section and the data signal, and may output the output signal from the delay section as the pulse current control signal, and may output an output signal from the logical sum operation section as the second bias current control signal.

Alternatively, when the rise time of the second bias current is shorter than the time corresponding to 1 bit length of burst data, and also the second bias current is sufficiently larger than the pulse current, the signal processing section may comprise a delay section for delaying the data signal by a predetermined time, and may output the output signal from the delay section as the pulse current control signal, and may output the data signal as the second bias current control signal.

By having the abovementioned construction, it becomes possible to achieve simplification of the circuit structure for realizing the signal processing means.

A driving method for a semiconductor laser according to the present invention, for driving a semiconductor laser in accordance with data signals including data generated in bursts, comprises: a step of generating, at least at a time of non-output of data, a first bias current for driving the semiconductor laser in a predetermined area within a spontaneous emission area, to supply the first bias current to the semiconductor laser; a step of generating a pulse current control signal in which the data signal is delayed, using only the data signal, and generating a second bias current control signal that rises more rapidly by a predetermined time than the rise of burst data included in the pulse current control signal; a step of generating a pulse current in accordance with the pulse current control signal, to supply the pulse current to the semiconductor laser; and a step of generating a second bias current for driving the semiconductor laser in a predetermined area within the spontaneous emission area in accordance with the second bias current control signal generated, to supply the second bias current to the semiconductor laser.

BEST MODE FOR CARRYING OUT THE INVENTION

Hereunder is a description of a driver circuit for a semiconductor laser according to the present invention based on the accompanying drawings.

Figure 6:
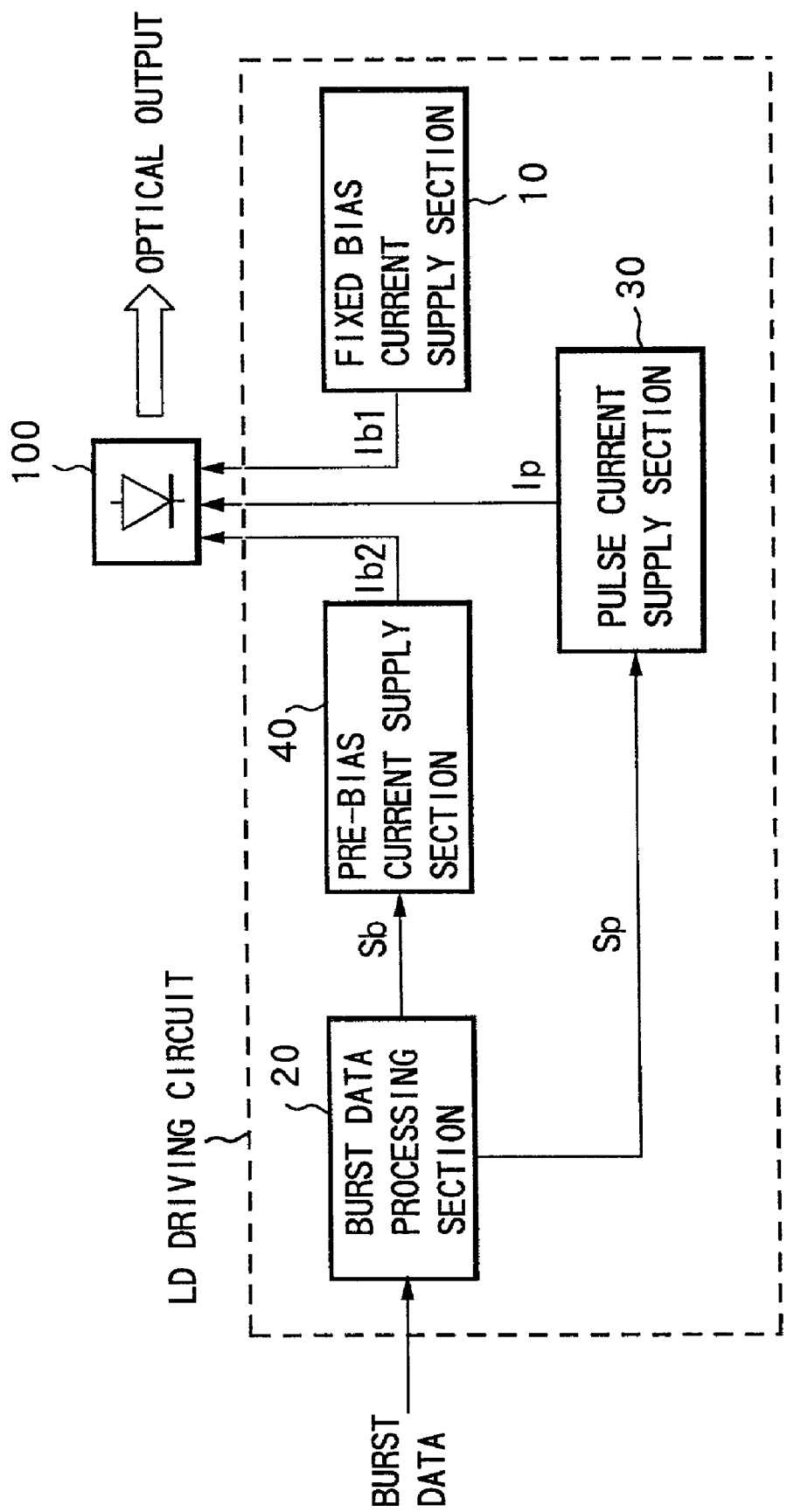
FIG. 6 is a block diagram showing a basic construction of a semiconductor laser driver circuit according to a first embodiment.

FIG. 6 is a block diagram showing a basic construction of a semiconductor laser driver circuit according to a first embodiment.

In FIG. 6, this driver circuit comprises: a fixed bias current supply section 10 serving as first bias current supply means that applies a fixed bias current Ib1 (first bias current) to a semiconductor laser (LD) 100, a burst data processing section 20 serving as a signal processing means that generates, based on burst data (a data signal) from outside, a pre-bias signal Sb corresponding to a second bias current control signal and a pulse signal Sp corresponding to a pulse current control signal, a pulse current supply section 30 serving as pulse current supply means that applies to the LD 100 a pulse current Ip generated in accordance with the pulse signal Sp, and a pre-bias current supply section 40 serving as second bias current control means that applies to the LD 100 pre-bias current Ib2 (second bias current) generated in accordance with the pre-bias signal Sb.

Figure 7:
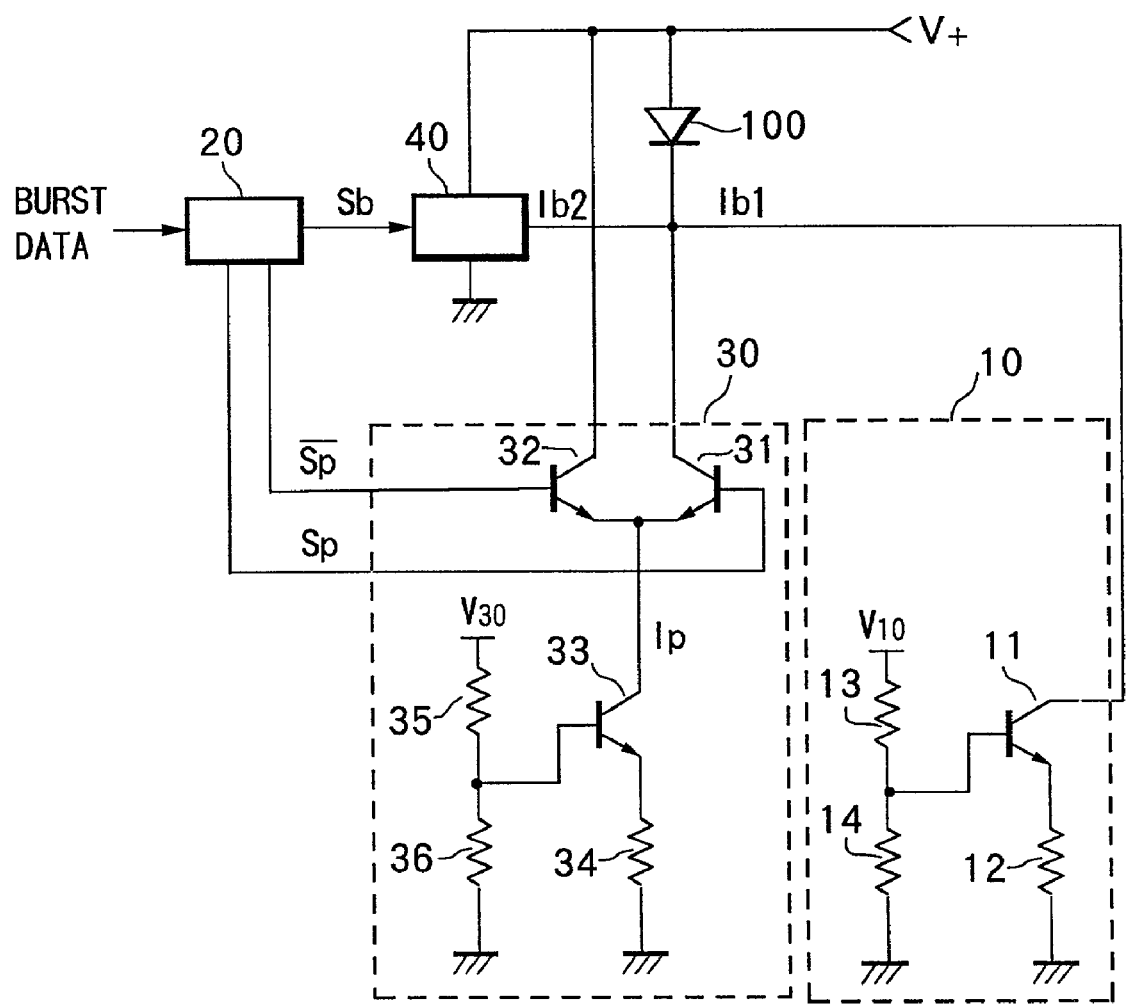
FIG. 7 is a diagram showing an example of a specific circuit structure of a fixed bias current supply section and a pulse current supply section in the first embodiment.

FIG. 7 is a diagram showing an example of a specific circuit structure of the fixed bias current supply section 10 and the pulse current supply section 30. In FIG. 7, an example using a bipolar transistor is given, however, the present invention is not limited to this, and a known active element such as a MOS transistor may be used. This is also the same in the other embodiments shown below.

In FIG. 7, the fixed bias current supply section 10 has for example a transistor 11 and resistors 12–14. The transistor 11 has a collector terminal connected to one end of the LD 100, an emitter terminal earthed via the resistor 12, and a base terminal connected to a common contact point between the resistors 13 and 14. A power supply voltage $V_+$ is applied to the other end of the LD 100. The resistors 13 and 14 are connected in series between a power supply terminal to which a power supply voltage $V_{10}$ is applied and an earth terminal, and a divided voltage at the mutual contact point is applied to the base terminal of the transistor 11.

The pulse current supply section 30 has, for example, transistors 31 and 32 constituting a current switch, a transistor 33 serving as a current source for the current switch, and resistors 34–36. The transistor 31 has a collector terminal connected to one end of the LD 100, an emitter terminal connected to an emitter terminal of the transistor 32 and a collector terminal of the transistor 33, and a base terminal to which the pulse signal Sp output from the burst data processing section 20 is applied. The transistor 32 has a collector terminal to which the power supply voltage $V_+$ is applied and a base terminal to which an inverted pulse signal /Sp from the burst data processing section 20 is applied. The transistor 33 has an emitter terminal earthed via the resistor 34, and a base terminal connected to a common contact point between the resistors 35 and 36. The resistors 35 and 36 are connected in series between a power supply terminal to which a required power supply voltage $V_{30}$ is applied and an earth terminal, and a divided voltage at the mutual contact point is applied to the base terminal of the transistor 33.

Figure 8:
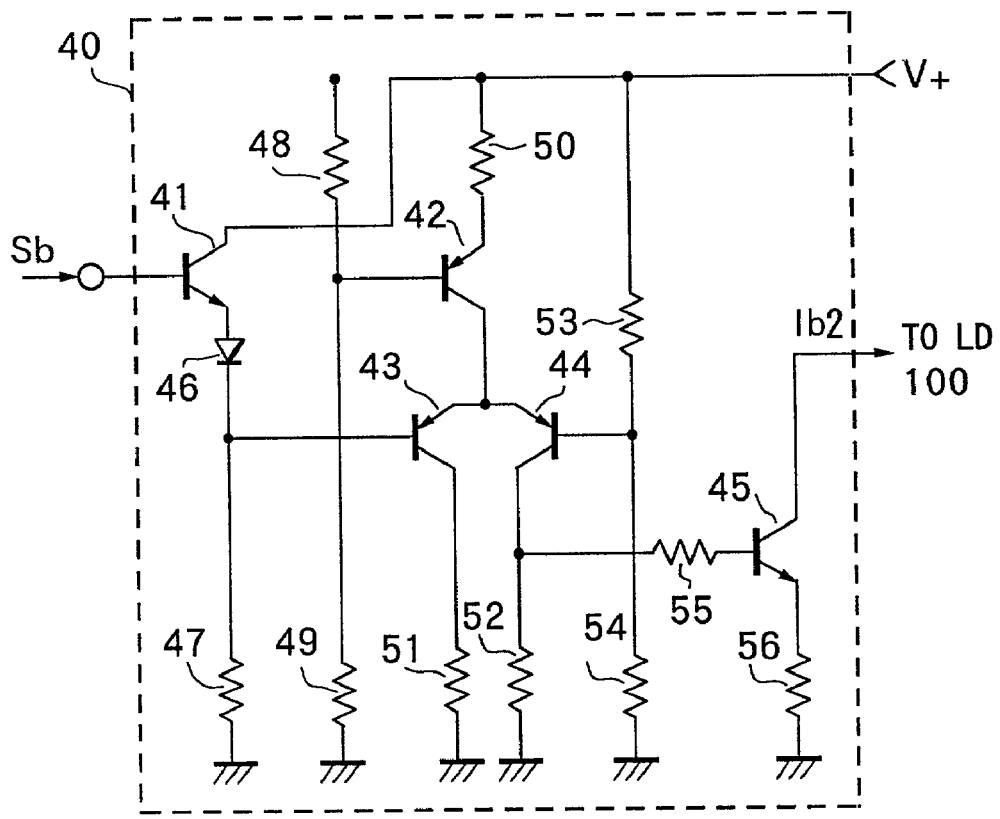
FIG. 8 is a diagram showing an example of a specific circuit structure of a pre-bias current supply section in the first embodiment.

FIG. 8 is a diagram showing an example of a specific circuit structure of the pre-bias current supply section 40.

In FIG. 8, the pre-bias current supply section 40 adopts, for example, a differential amplifier circuit serving as a basic circuit structure, for performing the rising and falling of the pre-bias current Ib2 at a high speed. Here, this comprises transistors 41–45, a diode 46 and resistors 47–56.

More specifically, the transistor 41 has a base terminal to which the pre-bias signal Sb output from the burst data processing section 20 is applied, a collector terminal to which the power supply voltage $V_+$ is applied, and an emitter terminal earthed via the diode 46 and the resistor 47. The transistor 42 has a base terminal connected to a common contact point between the resistors 48 and 49, and an emitter terminal to which the power source voltage $V_+$ is applied via the resistor 50. The resistors 48 and 49 are connected in series between a power supply terminal to which the power supply voltage $V_+$ is applied and an earth terminal, and a divided voltage at the mutual contact point is applied to the base terminal of the transistor 42. The transistor 43 has a base terminal connected to a common contact point between the diode 46 and the resistor 47, an emitter terminal connected to the collector terminal of the transistor 42 and an emitter terminal of the transistor 44, and a collector terminal earthed via the resistor 51. The transistor 44 has a base terminal connected to a common contact point between the resistors 53 and 54, and a collector terminal earthed via the resistor 52. The resistors 53 and 54 are connected in series between a power supply terminal to which the power supply voltage $V_+$ is applied and an earth terminal, and a divided voltage at the mutual contact point is applied to the base terminal of the transistor 44. The transistor 45 has a base terminal connected to the collector terminal of the transistor 44 via the resistor 55, a collector terminal connected to one end of the LD 100, and an emitter terminal earthed via the resistor 56.

Here is a description of an operation of the LD driving circuit of the abovementioned construction.

Figure 9:
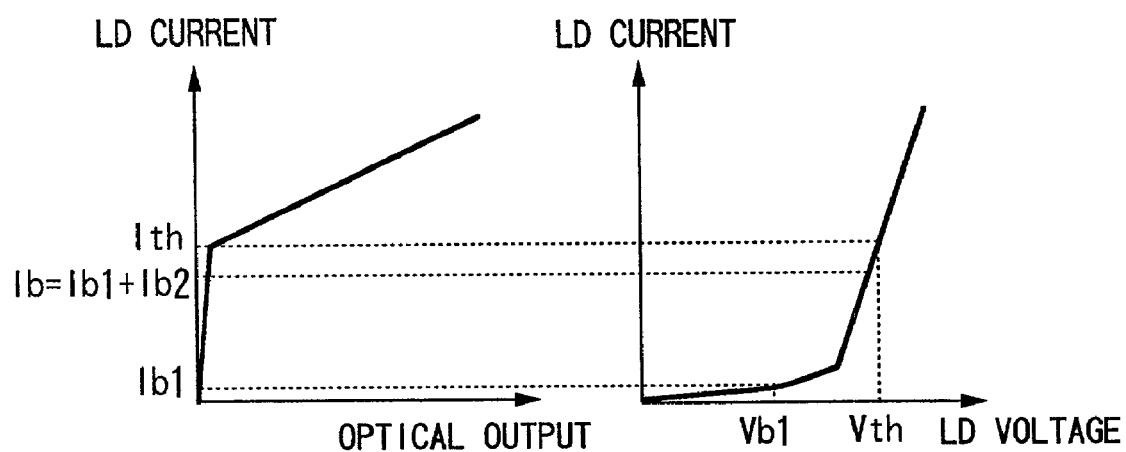
FIG. 9 is a diagram showing a relation between current and voltage supplied to an LD in the first embodiment.

At first, when the LD driving circuit is activated, the fixed bias current supply section 10 is operated and the fixed bias current Ibi is supplied to the LO 100. This fixed bias current Ibi is for previously supplying a bias current permitted on the system to the LD 100 when an optical output is not being emitted. Therefore, this must be set to a current value as close as possible to zero (for example, about several 10 µA–1 µA) within the spontaneous emission area of the LD 100. As shown in FIG. 9, if the current value Ibi is considered as a voltage applied to the LD 100, although the current value Ibi is small, it is required to direct an attention to that a voltage Vb1 of a comparatively large value is applied to the LO 100.

Then, when the burst data is input from the outside to the LD driving circuit, the pre-bias current Ib2 and the pulse current Ip are supplied to the LD 100 based on this burst data. Here, an example of the supply operation for the pre-bias current Ib2 and the pulse current Ip will be specifically described using the time chart of FIG. 10.

Figure 1:
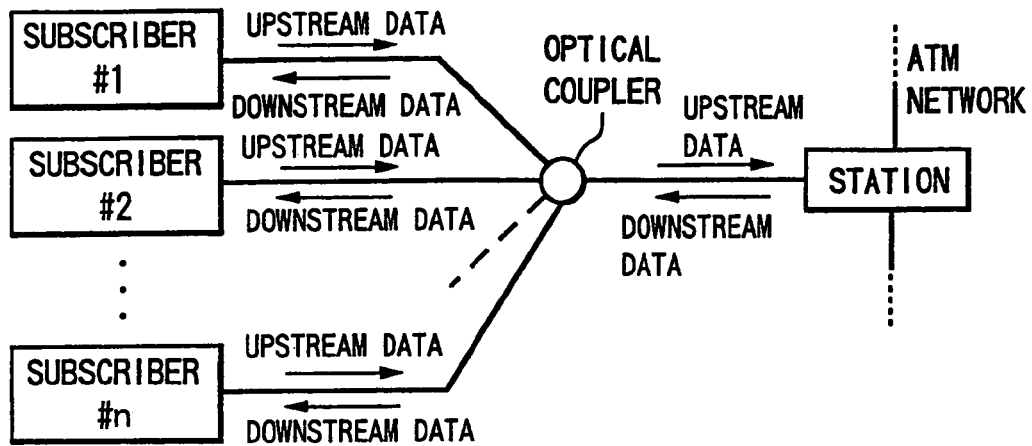
FIG. 1 is a diagram showing a construction of a typical ATM-PON.
Figure 2A:
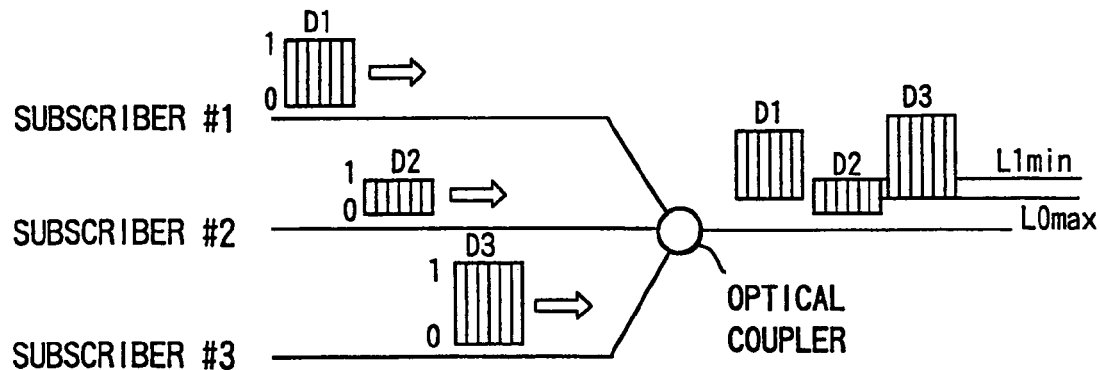
FIG. 2 is a diagram for explaining upstream data transmission in the ATM-PON.
Figure 2B:
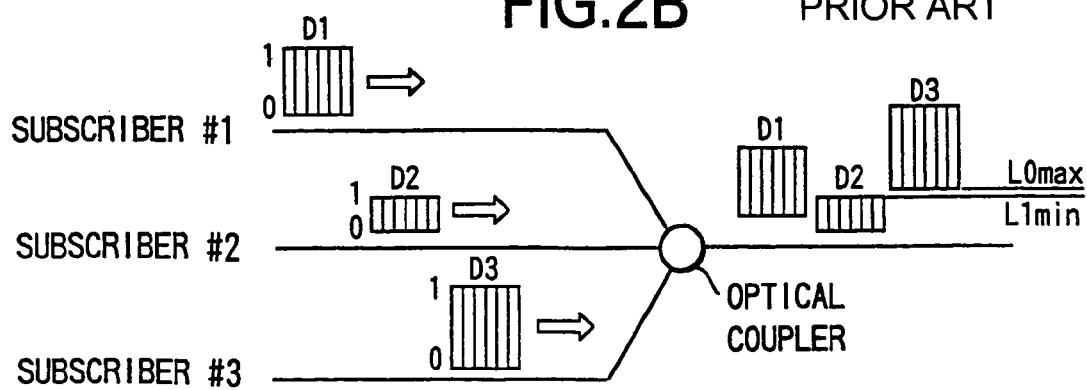
Figure 3:
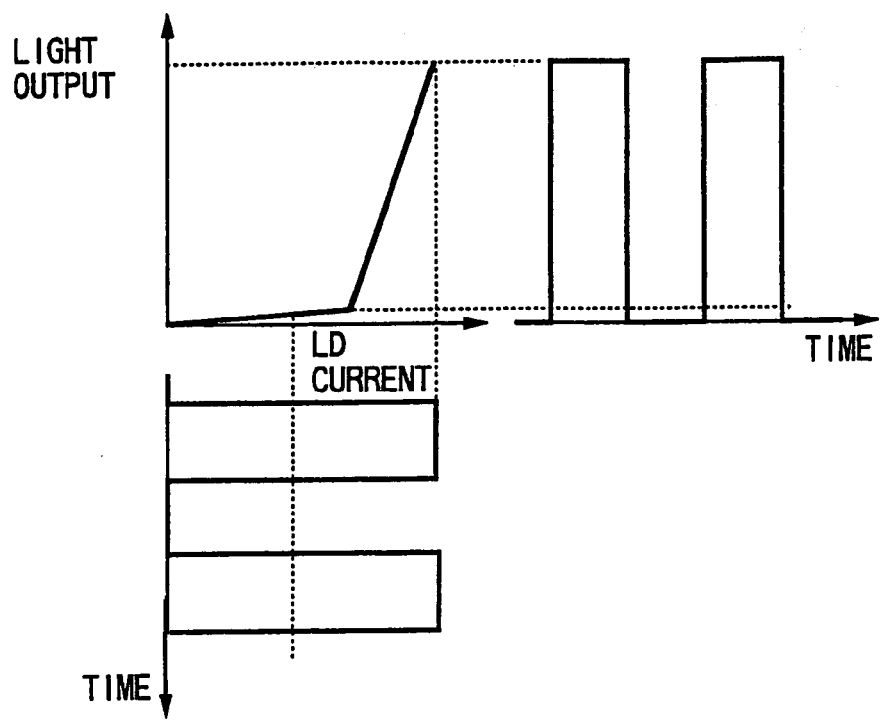
FIG. 3 is a diagram for explaining the theory of a conventional semiconductor laser driving method.
Figure 4:
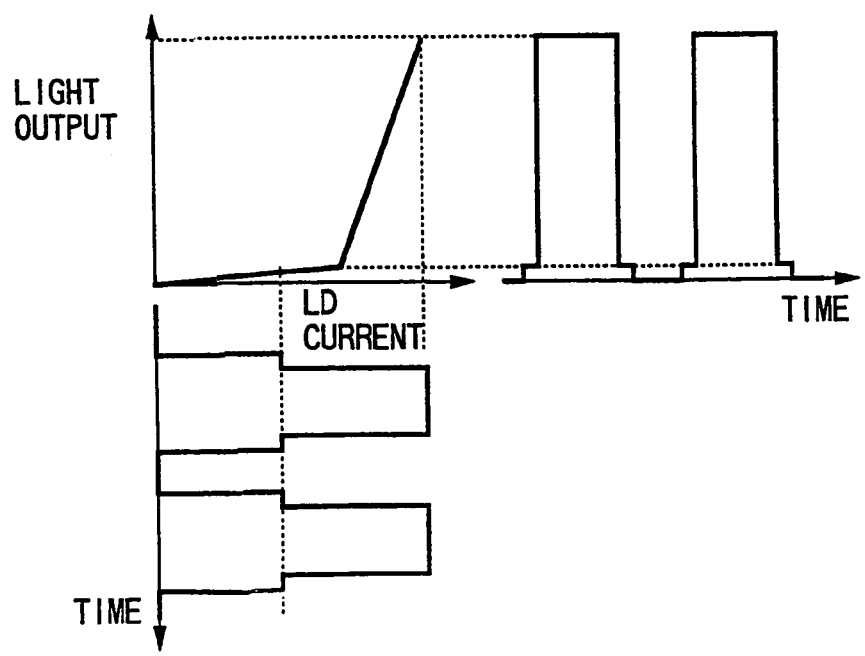
FIG. 4 is a diagram for explaining the theory of another conventional semiconductor laser driving method.
Figure 5:
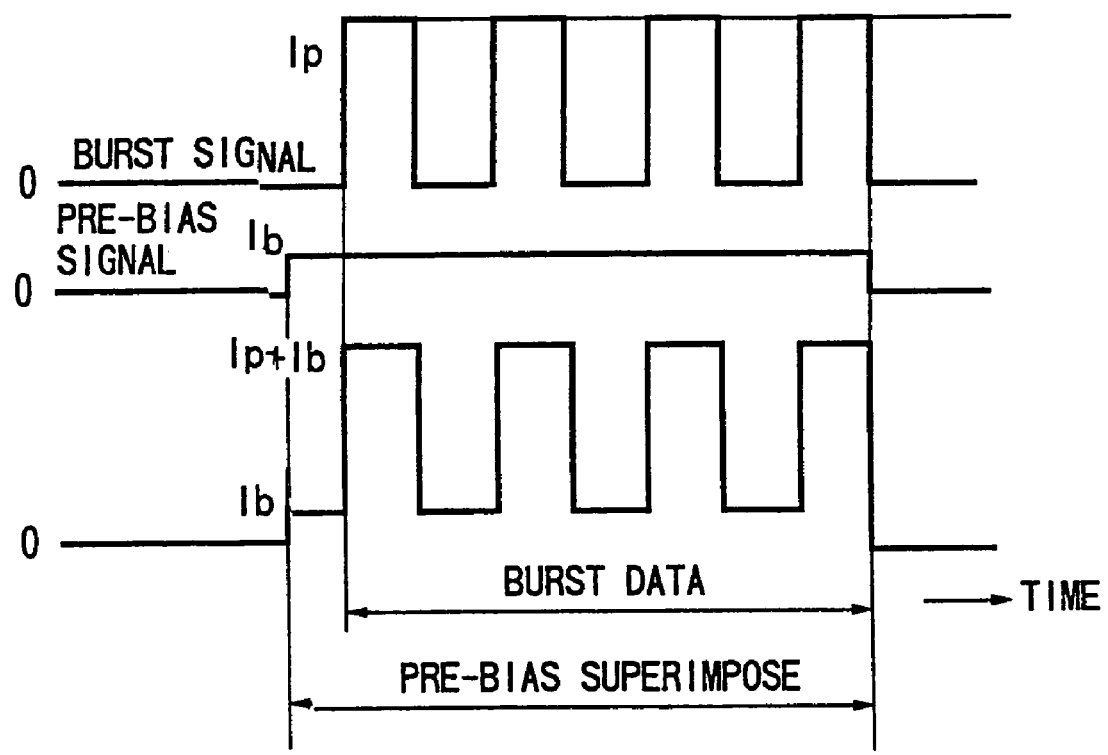
FIG. 5 is a diagram for explaining the theory of yet another conventional semiconductor laser driving method.
Figure 10:
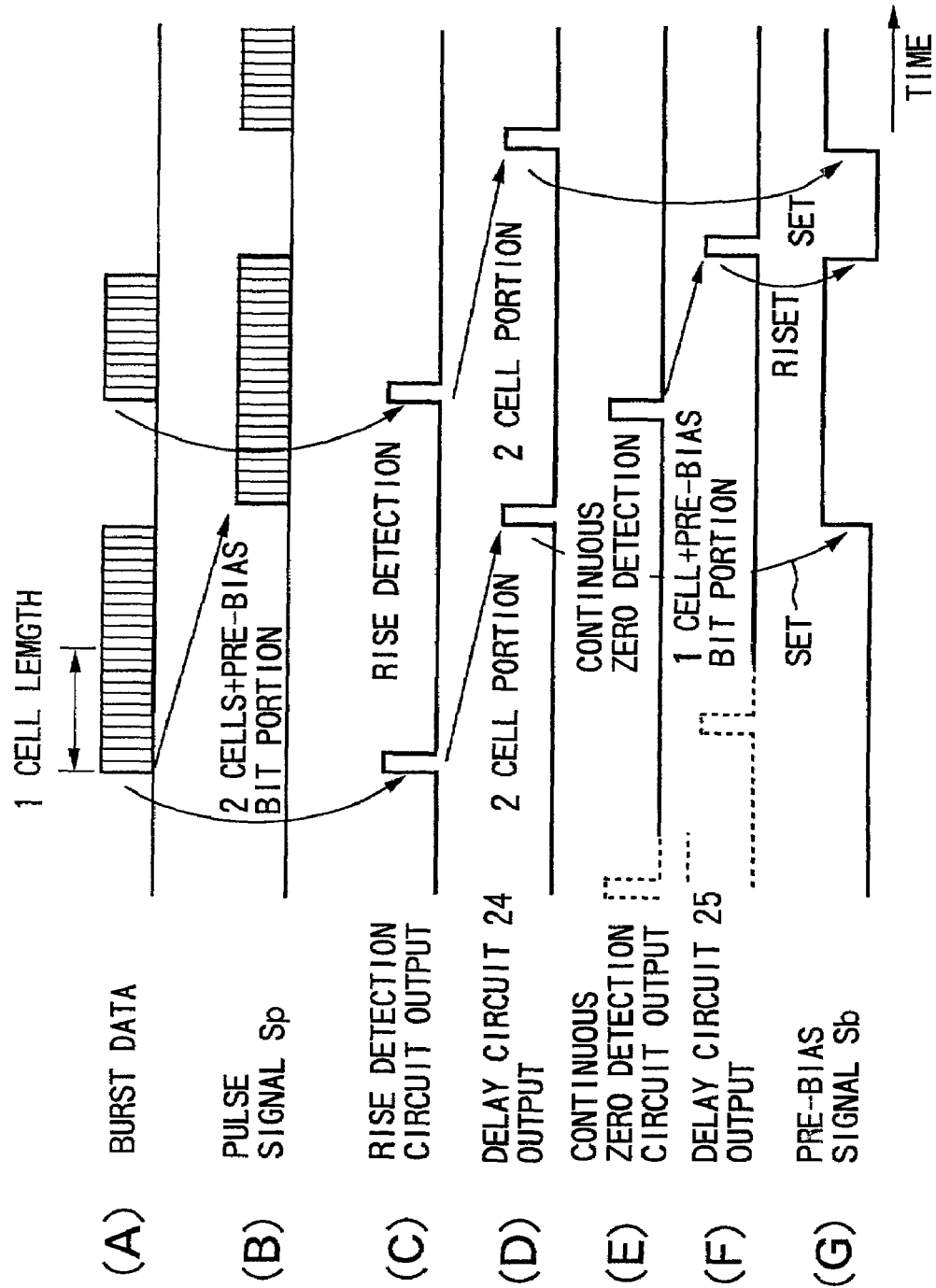
FIG. 10 is a time chart for explaining an example of a supply operation for a pre-bias current and a pulse current in the first embodiment.

In the LD driving circuit, the burst data including a fixed length cell signal as shown in (A) of FIG. 10 is input from the outside to the burst data processing section 20. This burst data, for example in a case where this LD driving circuit is applied to a transmission section of each subscriber side apparatus in the abovementioned ATM-PON shown in FIG. 1 in response to sending of a signal permitting transmission of upstream data onto the PON from a station side apparatus to the subscriber side apparatus, rises in a period in which the burst data of the applicable subscriber side apparatus is permitted (for example, one cell length as a unit). In the burst data processing section 20 that has been input with the burst data, the pre-bias signal Sb and the pulse signal Sp are generated based on this burst data.

Figure 11:
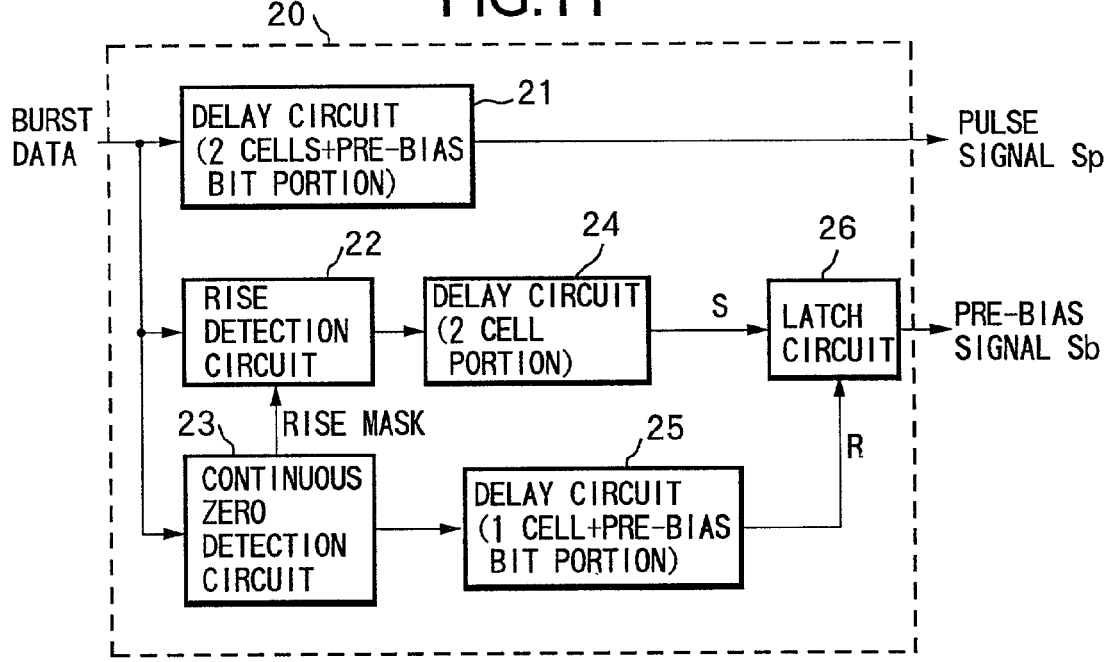
FIG. 11 is a functional block diagram showing an example of a burst data processing section in the first embodiment.

FIG. 11 is a functional block diagram for explaining an example of a specific operation of the burst data processing section 20.

As shown in FIG. 11, in the burst data processing section 20, the input burst data is respectively input to a delay circuit 21, a rise detection circuit 22 and a continuous zero detection circuit 23. In the delay circuit 21, the burst data is delayed (shifted) by a time corresponding to two cell lengths+a pre-bias bit portion, and the pulse signal Sp as shown in (B) of FIG. 10 is output. The abovementioned pre-bias bit specifies how fast the pre-bias signal Sb rises with respect to the rise of the pulse signal Sp, being a value which is previously set corresponding to the operating characteristics and the like of the LD 100.

Furthermore, the rise detection circuit 22 detects the rise of the input burst data (a change from a "0" level to a "1" level), and outputs a short pulse as shown in (C) of FIG. 10. The rise detection circuit 22, once detecting the rise of the burst data, performs a masking process of the rise detection result during a period until continuous zeros are detected by the later described continuous zero detection circuit 23. As a result, only the initial rise of the burst data for which there is a continuous change in the "1" and "0" levels is detected.

Then, an output signal from the rise detection circuit 22 is sent to a delay circuit 24, and is delayed by a time corresponding to two cell lengths, and a signal as shown in (D) of FIG. 10 is output from the delay circuit 24. Next, the output signal from the delay circuit 24 is sent to a set input terminal S of a latch circuit 26, and an output from the latch circuit 26 is changed from a low level to a high level to be output as the pre-bias signal Sb as shown in (G) of FIG. 10.

Furthermore, in the continuous zero detection circuit 23, counting of the number of continuous zero levels in the input burst data is performed using a counter or the like. For example, when the number of continuous zeros corresponding to one cell length is detected, a short pulse as shown in (E) of FIG. 10 is output. Then, an output signal from the continuous zero detection circuit 23 is sent to a delay circuit 25 and delayed by a time corresponding to one cell length+a pre-bias bit portion, and a signal as shown in (F) of FIG. 10 is output from the delay circuit 25. Next, the output signal from the delay circuit 25 is sent to a reset input terminal R of the latch circuit 26, and the output from the latch circuit 26, that is, the pre-bias signal Sb shown in (G) of FIG. 10, is reset from the high level to the low level.

By repeating the abovementioned series of processing operations, the pulse signal Sp delayed by the two cell lengths+the pre-bias bit portion and the pre-bias signal Sb delayed by the portion of two cell lengths, with respect to the burst data, are automatically generated.

Then, the pre-bias signal Sb generated in the burst data processing section 20 is sent to the pre-bias current supply section 40, and while the pre-bias signal Sb is a high level, the pre-bias current Ib2 of a required value is supplied to the LD 100. This pre-bias current Ib2 is one for pre-supplying a bias current permitted on the system immediately before and during transmission of burst data, to the LD 100. The current value thereof is set so that a current value Ib for when the fixed bias current Ib1 is added (=Ib1+Ib2) is less than a threshold value current Ith of the LD 100, that is, so that the current value Ib is within the spontaneous emission area (refer to FIG. 9). As specific set values for the fixed bias current Ib1 and the pre-bias current Ib2, for example, preferably the fixed bias current Ib1 becomes approximately 1/10 times the current value Ib. However, the present invention is not limited to this.

Furthermore, the pulse signal Sp generated by the burst data processing section 20 is sent to the pulse current supply section 30 together with the inverted signal /Sp thereof, and the pulse current Ip corresponding to the burst data is supplied to the LD 100.

Figure 12:
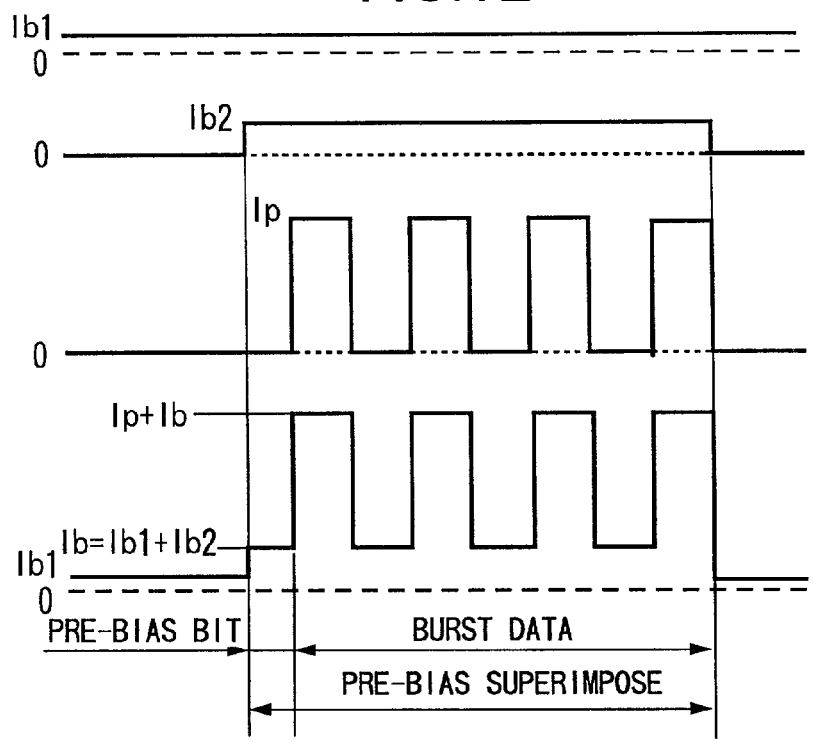
FIG. 12 is a diagram showing an example of fixed bias current, pre-bias current and pulse current supplied to an LD in the first embodiment.

FIG. 12 is a diagram showing an example of the fixed bias current Ib1, the pre-bias current Ib2 and the pulse current Ip to be supplied to the LD 100, respectively.

As shown in FIG. 12, the fixed bias current Ib1 is always supplied to the LD irrespective of whether or not the burst data is transmitted. On the other hand, the pre-bias current Ib2 rises faster than the rise of the burst data by a pre-bias bit amount, and falls together with the end of the burst data. Such fixed bias current Ib1 and pre-bias current Ib2 are superimposed on the pulse current Ip, and a bias current shown at the bottom of FIG. 12 is supplied to the LD 100.

As a result, at the time of non-transmission of burst data, an ultra small current of the fixed bias current Ib1 flows to the LD 100. However, since the optical output at this time is a level permitted on the system, that is, a level sufficiently lower than the "0" level of the optical output sent from the other subscriber side apparatus, this ultra small current does not exert an influence on the burst transmission.

Furthermore, since the fixed bias current Ib1 is applied to the LD 100 immediately before supplying the pre-bias current Ib2 to the LD 100, the rise time of the pre-bias current Ib2 can be shortened. That is to say, this is involved in the shortening of the supply time of the pre-bias current. In addition, by supplying the pre-bias current Ib2, the carrier density inside the LD 100 reaches to close to the threshold value carrier density. Therefore, at the time of transmission of burst data, the optical output waveform of the LD 100 becomes possible to reliably rise from the head waveform of the burst data, without the waveform deterioration due to oscillation delay and the like.

In this manner, according to the first embodiment, by controlling the supply of fixed bias current and pre-bias current corresponding to the transmission condition of the burst data at an appropriate timing, an LD driving circuit capable of accurately performing high speed transmission of burst data can be realized. Furthermore, this LD driving circuit processes the burst data to determine the supply timing for the pre-bias current. As a result, there is no longer the need to apply, separately to the burst data from outside, a signal (enable signal or the like) indicating transmission or non-transmission of burst data as heretofore. Hence, it is possible to flexibly cope with various transmission systems.

Next is a description of a second embodiment of the present invention. In the second embodiment, a case is considered where the fixed bias current Ib1 is variable corresponding to fluctuations in ambient temperature.

Figure 13:
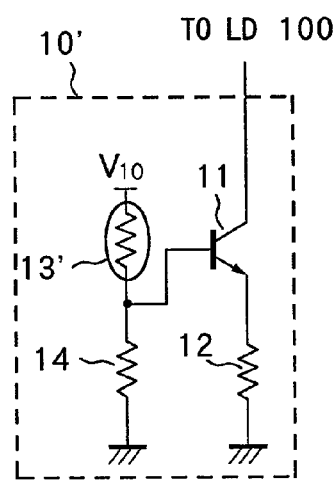
FIG. 13 is a circuit diagram showing a construction of a fixed bias current supply section used in a second embodiment.

FIG. 13 is a circuit diagram showing a construction of a fixed bias current supply section used in the second embodiment. The construction of parts other than the fixed bias current supply section is the same as for the case of the first embodiment and hence description is omitted.

In FIG. 13, a fixed bias current supply section 10' is constructed so that, for example, a thermistor 13' is provided instead of the resistor 13 which applies a fixed resistance value in the construction of the fixed bias current supply section 10 of the first embodiment. The construction of parts other than the above is the same as for the case of the first embodiment.

In the thermistor 13', the resistance value thereof is changed corresponding to the ambient temperature, and the voltage level at the contact point with the resistor 14 is changed corresponding to the ambient temperature. Here, the thermistor 13' is arranged in the vicinity of the LD 100, so that the voltage applied to the base terminal of the transistor 11 fluctuates corresponding to temperature changes in the LD 100, to thereby control the fixed bias current Ib1 supplied to the LD 100. The temperature characteristics of the thermistor 13' are set beforehand so as to correspond to the temperature characteristics of the LD 100.

By using the fixed bias current supply section 10' of the above described construction, the fixed bias current Ib1 is also changed following characteristic changes due to temperature change in the LD 100. Therefore, transmission of burst data can be more reliably performed.

Next is a description of a third embodiment of the present invention. In the third embodiment, a case is considered where the output light from the LD 100 is monitored to feedback control the fixed bias current Ib1.

Figure 14:
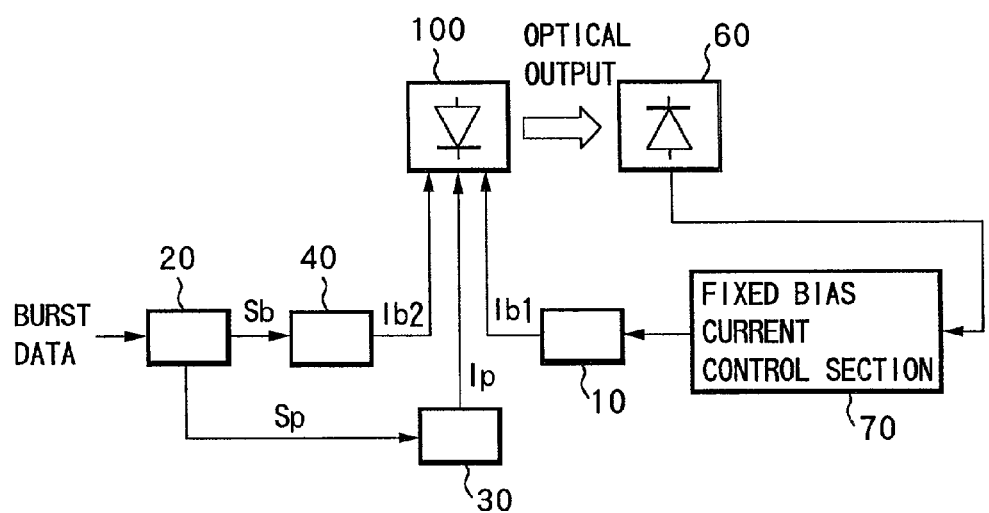
FIG. 14 is a block diagram showing a construction of an LD driving circuit of a third embodiment.

FIG. 14 is a block diagram showing a construction of an LD driving circuit of the third embodiment.

In FIG. 14, this LD driving circuit is constructed so that a monitor light receiving section 60 serving as optical output detection means, and a fixed bias current control section 70 serving as first bias current control means, are added to the construction of the first embodiment.

The monitor light receiving section 60 receives a part of the light output from the LD 100 and generates a monitor current, to output the monitor current to the fixed bias current control section 70. The monitor light receiving section 60 is provided with a light receiving element (PD) having sufficient light reception sensitivity with respect to weak light (spontaneous emission light) emitted from the LD 100 by the supply of the fixed bias current Ib1 at the time of non-transmission of burst data. Furthermore, in a case where the monitor current output from the light receiving element does not reach a sufficient level, an amplifier or the like for amplifying the monitor current to a required level may be disposed.

Figure 15:
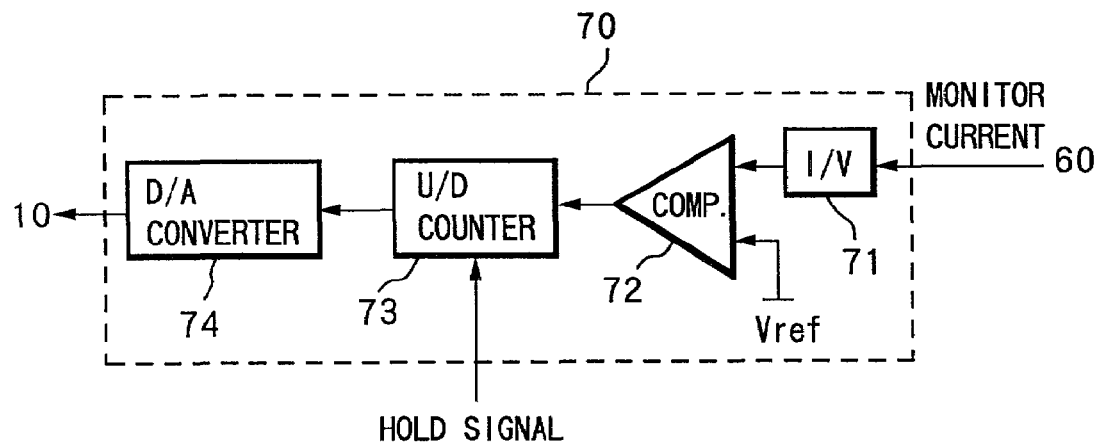
FIG. 15 is a block diagram showing a construction of a fixed bias current control section in the third embodiment.

The fixed bias current control section 70 has, for example as shown in FIG. 15, a current/voltage converter (I/V) 71, a comparator (COMP) 72, a U/D counter 73 and a D/A converter 74. The I/V converter 71 converts the monitor current sent from the monitor light receiving section 60 to a voltage, to send this to one input terminal of the comparator 72. A previously set reference voltage Vref is applied to the other input terminal of the comparator 72. The comparator 72 compares the output voltage from the I/V converter 71 with the reference voltage Vref, to output a signal corresponding to a difference between the voltage levels to the U/D counter 73. The U/D counter 73, in accordance with a hold signal from outside, transmits an output signal from the comparator 72 to the D/A converter 74 when burst data is not transmitted. For this hold signal, for example, the pre-bias signal Sb or the like may be used. When the pre-bias signal Sb is a low level, the U/D counter 73 transmits the output signal from the comparator 72, to the D/A converter 74, while when a high level, transmission of the output signal is interrupted. The D/A converter 74 converts a digital signal that has been sent from the comparator 72 via the U/D counter 73 to an analog signal, to output this to the fixed bias current supply section 10.

With the LD driving circuit constructed as described above, at the time of non-transmission of burst data, the power of the optical output from the LD 100 is monitored by the monitor light receiving section 60, and based on the monitor current, a signal for controlling the fixed bias current Ib1 so that the optical output power at the time of non-transmission becomes a previously set constant level, is generated in the fixed bias current control section 70, to be fed back to the fixed bias current supply section 10. More specifically, the feedback control of the fixed bias current Ib1 is performed, for example, by changing the value of the power source voltage $V_{10}$ applied to one end of the resistor 13 of the fixed bias current supply section 10 in accordance with the output signal from the fixed bias current control section 70. However, the method of controlling the fixed bias current Ib1 in the fixed bias current supply section 10 is not limited to the above method.

In this manner, according to the third embodiment, at the time of non-transmission of burst data, by feedback controlling the fixed bias current Ib1 and executing so-called APC (Automatic Power Control), it becomes possible to more reliably perform transmission of burst data.

In the above described third embodiment, as with the case of the second embodiment, it is of course possible to also use the fixed bias current supply section 10' which uses a thermistor 13', instead of the fixed bias current supply section 10.

Next is a description of a fourth embodiment of the present invention. In the fourth embodiment, a case is considered where the pre-bias current Ib2 is variable corresponding to fluctuations in ambient temperature.

Figure 16:
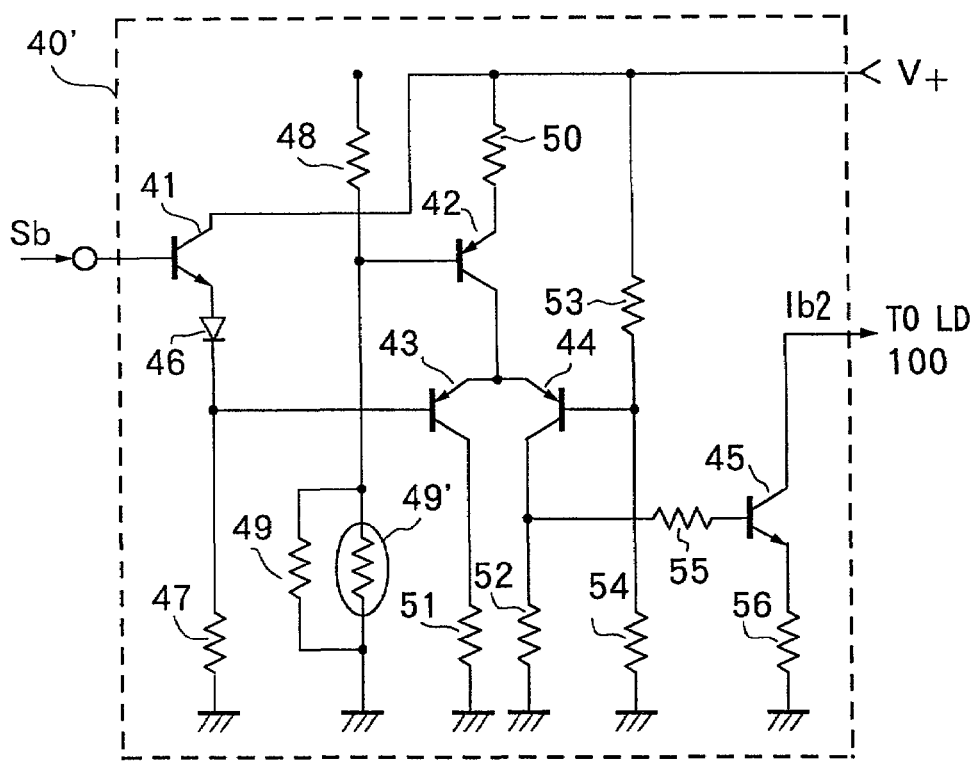
FIG. 16 is a circuit diagram showing a construction of a pre-bias current supply section used in a fourth embodiment.

FIG. 16 is a circuit diagram showing a construction of a pre-bias current supply section used in the fourth embodiment. The construction of parts other than the pre-bias current supply section is the same as for the case shown in any of the first through third embodiments and hence description thereof is omitted.

In FIG. 16, a pre-bias current supply section 40' is constructed so that a thermistor 49' is provided in a parallel relationship with the resistor 49 for applying a fixed resistance value, for example in the construction of the fixed bias current supply section 10 (refer to FIG. 8) of the first embodiment. The construction of parts other than the above is the same as for the case of the first embodiment.

In the thermistor 49', the resistance value thereof is changed corresponding to the ambient temperature, and the voltage level at the contact point with the resistor 48 is changed corresponding to the ambient temperature. Here, the thermistor 49' is arranged close to the LD 100, so that the pre-bias current Ib2 supplied to the LD 100 from the pre-bias current supply section 40' is controlled corresponding to temperature changes in the LD 100. The temperature characteristics of the thermistor 49' are set beforehand so as to correspond to the temperature characteristics of the LD 100.

By using the pre-bias current supply section 40' of the above described construction, the pre-bias current Ib2 is changed following characteristic changes due to temperature change of the LD 100. Therefore, transmission of burst data can be more reliably performed.

Next is a description of a fifth embodiment of the present invention.

In the abovementioned first through fourth embodiments, the pre-bias current Ib2 is supplied to the LD 100 over the whole area (period) to be transmitted with the burst data. However, in a case where the pre-bias current Ib2 is sufficiently small compared to the pulse current Ip, once transmission of burst data is started, then taking into consideration the carrier density in the LD 100, if the pre-bias current Ib2 is applied in an area of part of the head side rather than being applied to the whole burst data transmission area, the burst data can be transmitted at a high speed. In the fifth embodiment, a description is given for a specific example of the above case.

Figure 17:
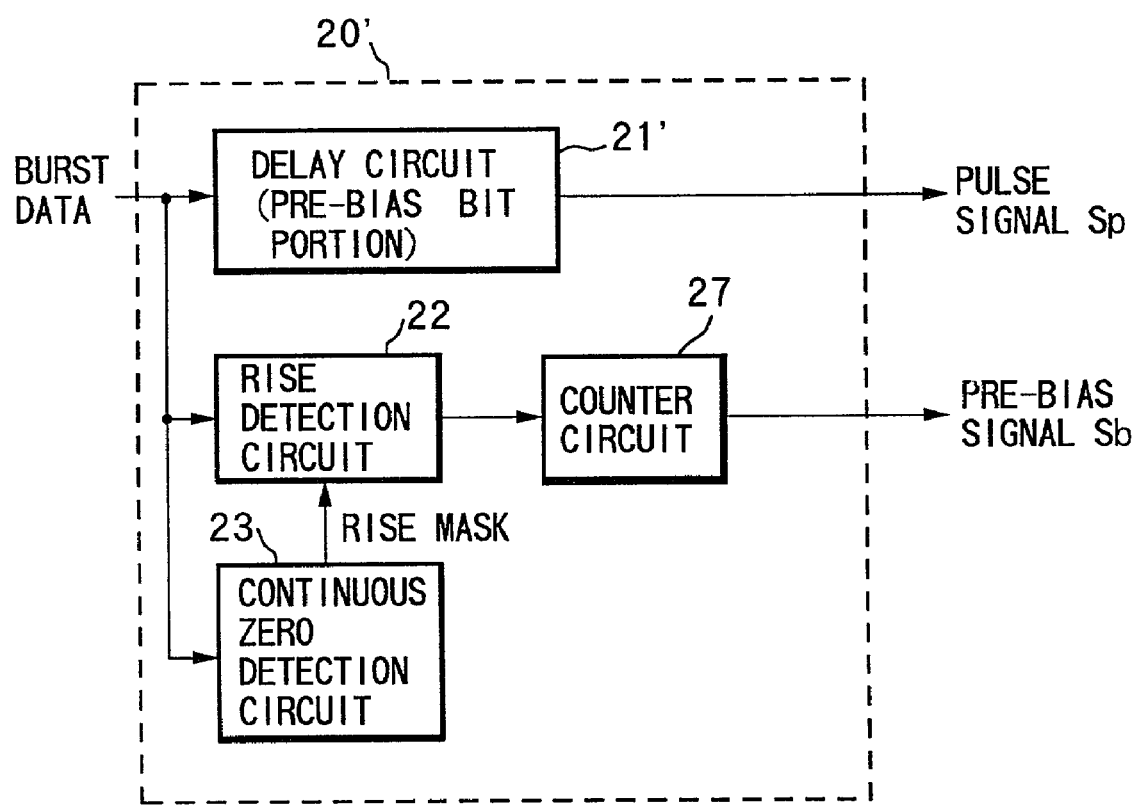
FIG. 17 is a functional block diagram showing a construction of a burst data processing section used in a fifth embodiment.

FIG. 17 is a functional block diagram showing a construction of a burst data processing section used in the fifth embodiment. The construction of parts other than the burst data processing section is the same as for the case of any of the abovementioned respective embodiments and hence description is omitted.

In FIG. 17, regarding a burst data processing section 20' used in this embodiment, a delay circuit 21' is used instead of the delay circuit 21 in the abovementioned burst data processing section 20 shown in FIG. 11, and a counter circuit 27 is disposed instead of the delay circuits 24 and 25 and the latch circuit 26. The construction of other parts is the same as for the case of the aforementioned respective embodiments.

The delay circuit 21' delays (shifts) the input burst data by a time corresponding to the abovementioned pre-bias bit portion, and outputs this as the pulse signal Sp to the pulse current supply section 30. When the counter circuit 27 receives the rise detection signal sent from the rise detection circuit 22, this activates the counter simultaneously with the output level changing to the high level, and maintains a high level output for a predetermined period (for example a period corresponding to 1–N bits of burst data).

Regarding the operation of the LD driving circuit using the above described burst data processing section 20', only the process for generating the pulse signal Sp and the pre-bias signal Sb from the burst data is different from the abovementioned respective embodiments, the other processes being the same as for the case of the abovementioned respective embodiments. Here, an operation of the burst data processing section 20' will be described in detail using the time chart of FIG. 18.

Figure 18:
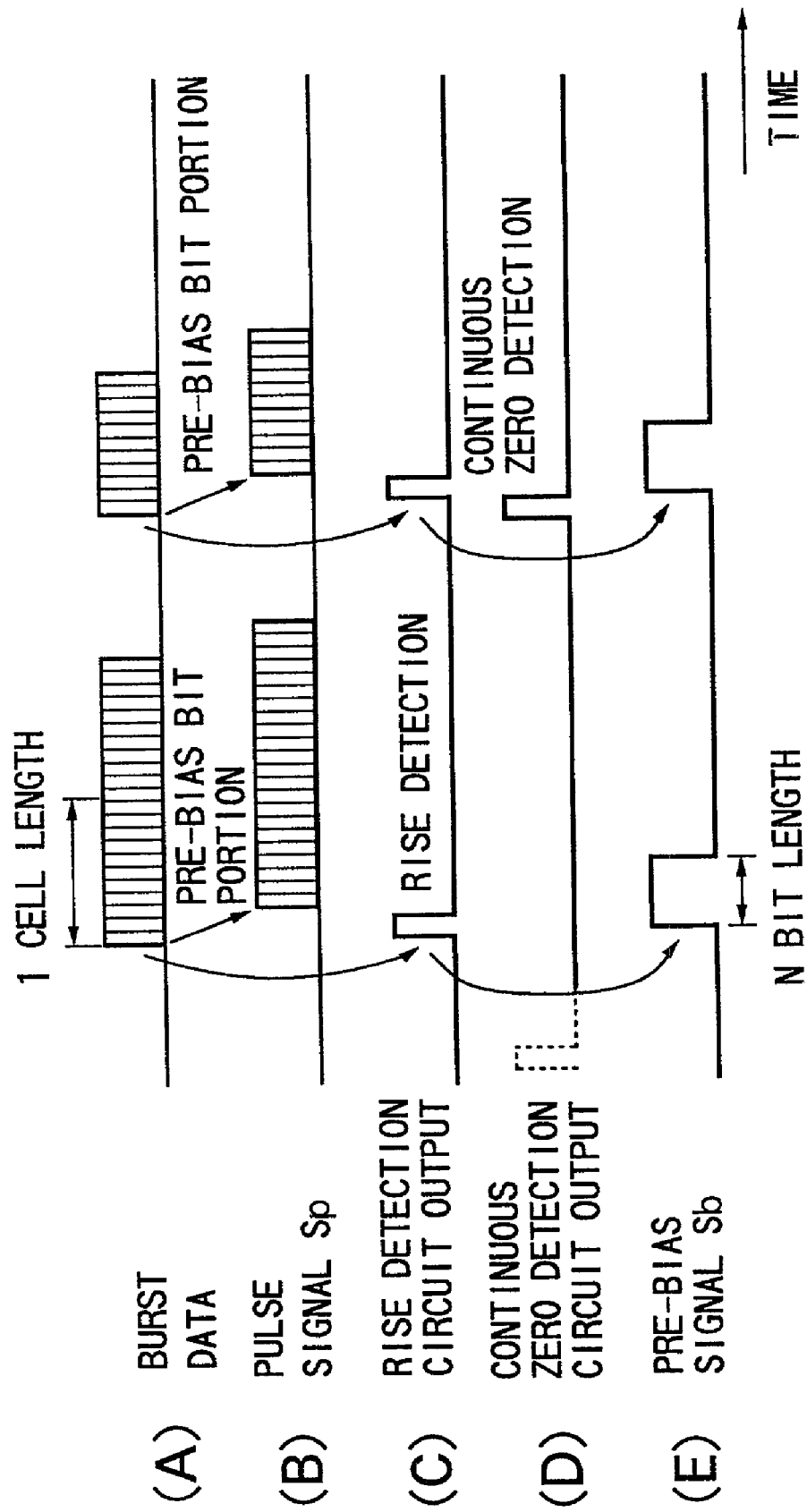
FIG. 18 is a time chart for explaining an operation of the burst data processing section in the fifth embodiment.

When the burst data shown in (A) of FIG. 18 is input to the burst data processing section 20', the burst data is respectively sent to the delay circuit 21', the rise detection circuit 22 and the continuous zero detection circuit 23. In the delay circuit 21', the burst data is delayed by the pre-bias bit portion, to be output as a pulse signal Sp as shown in (B) of FIG. 18. Simultaneously with this, in the rise detection circuit 22, the rise of the burst data is detected and a short pulse as shown in (C) of FIG. 18 is output. The rise detection circuit 22, once detecting the rise of the burst data, as shown in (D) of FIG. 18, mask processes the rise detection result during the period until continuous zeros are detected in the continuous zero detection circuit 23.

Moreover, when the short pulse is output from the rise detection circuit 22, the counter circuit 27 is activated and an output signal for holding a high level over a period corresponding to the 1–N bits of the head side of the burst data is generated, to be output as the pre-bias signal Sb as shown in (E) of FIG. 18.

In this manner, according to the fifth embodiment, in a case where the pre-bias current Ib2 is sufficiently small compared to the pulse current Ip, even if the supply of the pre-bias current Ib2 is only in the range of the head side N bit of the burst data, transmission of burst data can be reliably performed. In this case, the pre-bias bit portion is sufficient for the delay amount of the burst data (pulse signal Sp). Moreover, since the time for driving the pre-bias current Ib2 is also short, it is possible to achieve the circuit operation at a high speed.

Next is a description of a sixth embodiment of the present invention.

In the abovementioned respective embodiments, it is assumed that the pre-bias current Ib2 is supplied to the LD 100 from several bits before the head (before the pre-bias bit portion) of the burst data. However, in a case where the transmission speed of the optical signal is comparatively slow, for example, the rise time of the pre-bias signal Sb is shorter than the time corresponding to one bit length of the burst data, normal burst transmission can be realized even if the pre-bias current is supplied to the LD 100 before a time corresponding to less than one bit length. Therefore, in the sixth embodiment, a description is given for a specific example in the abovementioned case.

Figure 19:
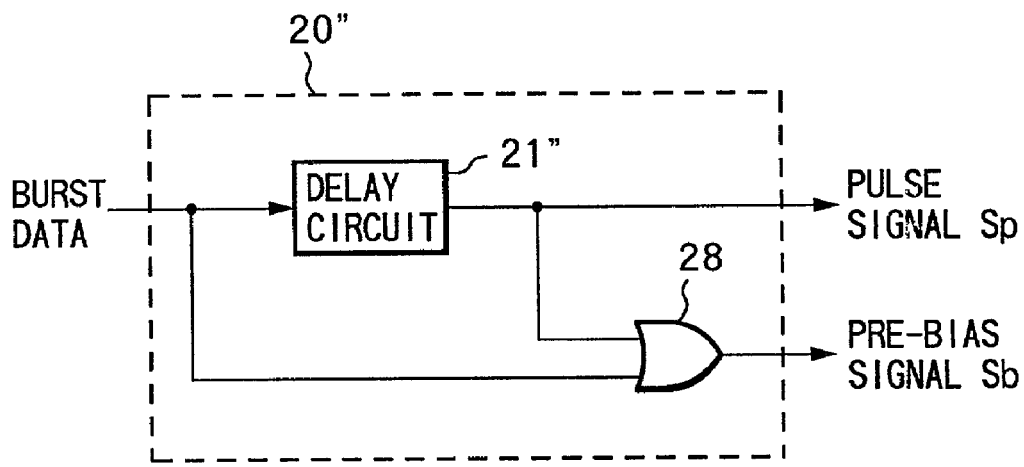
FIG. 19 is a diagram showing a construction of a burst data processing section used in a sixth embodiment.

FIG. 19 is a functional block diagram showing a construction of a burst data processing section used in the sixth embodiment. The construction of parts other than the burst data processing section is the same as for the case of the abovementioned respective embodiments and hence description is omitted.

In FIG. 19, a burst data processing section 20" used in this embodiment comprises a delay circuit 21" and a logical sum circuit 28. The delay circuit 21" delays the input burst data by a predetermined time, and respectively outputs this as a pulse signal Sp to the pulse current supply section 30 and the logical sum circuit 28. This delay time is set to a time corresponding to less than one bit length of the burst data. The logical sum circuit 28 is input with the burst data to one input terminal thereof, and a signal from the delay circuit 21" to the other input terminal thereof, and computes a logical sum of the burst data and the delayed burst data, to output this as a pre-bias signal Sb.

Figure 20:
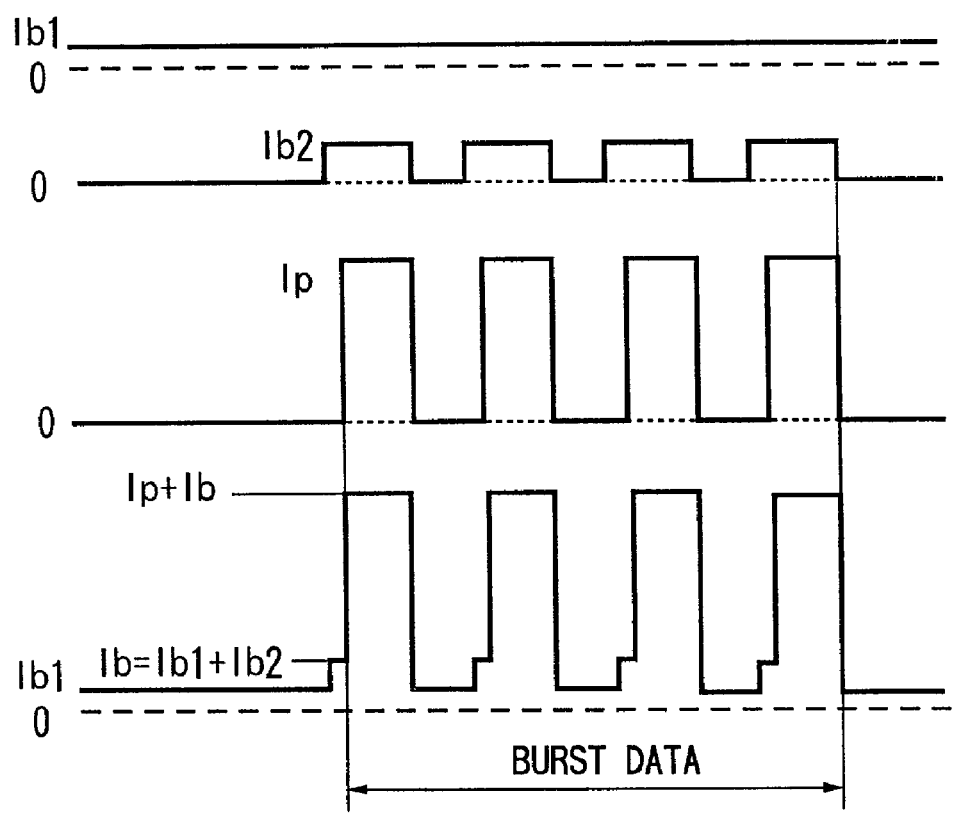
FIG. 20 is a diagram showing an example of fixed bias current, pre-bias current and pulse current supplied to an LD in the sixth embodiment.

In the LD driving circuit using the burst data processing section 20" of the above described construction, the fixed bias current Ib1, the pre-bias current Ib2 and the pulse current Ip as illustrated in FIG. 20 are supplied to the LD 100. That is to say, the pre-bias currents Ib2 is supplied to the LD 100, corresponding to the "1" level of the pulse signal Sp. As a result, an optical output showing the "1" levels of each bit rises without the occurrence of waveform deterioration due to oscillation delay of the LD 100.

In this manner, according to the sixth embodiment, in a case where the transmission speed of the optical signal is comparatively slow, and the rise of the pre-bias signal Sb is steep, transmission of burst data can be reliably performed even though the burst data processing section 20" of simpler construction is used.

Figure 21:
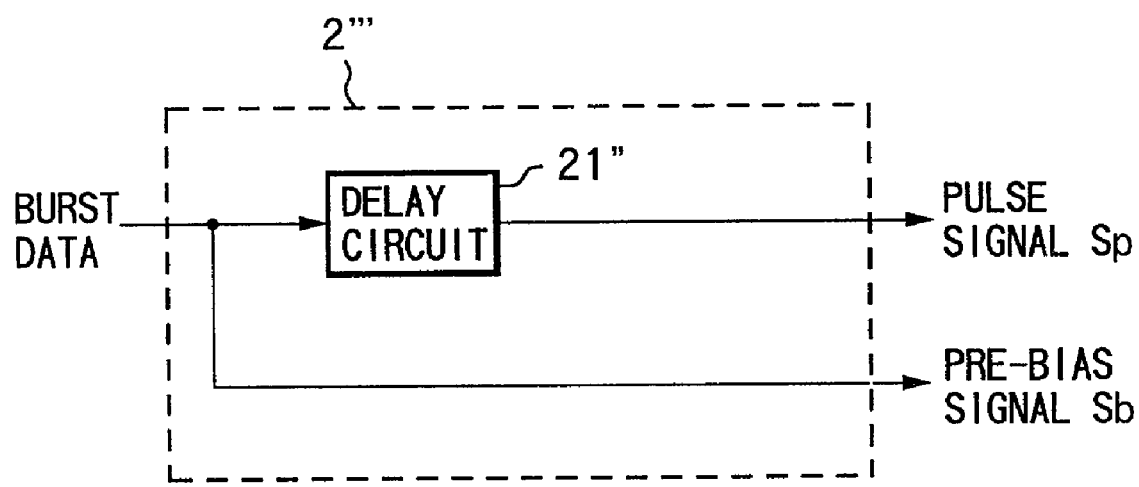
FIG. 21 is a diagram showing another construction example of burst data processing section related to the sixth embodiment.

In the abovementioned sixth embodiment, the description has been for a construction where the respective fall times of the pre-bias signal Sb and the pulse signal Sp (burst data) coincide with each other. However, for example, when the pre-bias current Ib2 is sufficiently small compared to the pulse current Ip, taking into consideration the carrier density inside the LD 100 as with the case of the abovementioned fifth embodiment, even if the pre-bias current is supplied to the LD 100 before and after the rise part of the respective "1" level bits of the burst data, the burst data can be transmitted at a high speed. A construction example for a burst data processing section for this case is shown in FIG. 21. In a burst data processing section 20''', the burst data which has been delayed by the delay circuit 21" is output as the pulse signal Sp, and the input burst data is output as it is, as the pre-bias signal Sb.

Furthermore, in the abovementioned first through sixth embodiments, the construction is adopted where the fixed bias current supply section 10 is provided and the fixed bias current Ib1 is applied to the LD 100. However, a case is also assumed where even if the construction is such that the fixed bias current supply section 10 is not provided, a current corresponding to the fixed bias current Ib1 is supplied to the LD 100 due for example to leakage current, depending on the characteristics such as of the transistors constituting the LD driving circuit. In this case, an operational effect the same as for the abovementioned respective embodiments can be obtained without separately providing the fixed bias current supply section 10.

Moreover, the fixed bias current supply section and the pre-bias current supply section are given different circuit structures. However, for example, it is also possible to apply the circuit structure of the pre-bias current supply section as the circuit structure of the fixed bias current supply section. In this case, an inverted signal of the pre-bias signal Sb may be applied to the fixed bias current supply section, and the respective circuit elements may be set so as to pass a current of a value the same as for the abovementioned fixed bias current.

The present invention, as a driving method for a semiconductor laser applicable to an optical transmission apparatus for performing burst data transmission, has considerable industrial applicability. In particular, this is useful for application to an optical communication system with a high transmission speed.

What is claimed is:

1. A driver circuit for driving a semiconductor laser in accordance with a data signal including data generated in bursts, comprising:
   first bias current supply means for generating, at least at a time of non-output of data, a first bias current for driving the semiconductor laser in a predetermined area within a spontaneous emission area, to supply the first bias current to the semiconductor laser;
   signal processing means for generating a pulse current control signal in which the data signal is delayed, using only the data signal, and generating a second bias current control signal that rises more rapidly by a predetermined time than the rise of the burst data included in the pulse current control signal;
   pulse current supply means for generating a pulse current in accordance with the pulse current control signal generated in said signal processing means, to supply the pulse current to the semiconductor laser; and
   second bias current supply means for generating a second bias current for driving the semiconductor laser in a predetermined area within the spontaneous emission area in accordance with the second bias current control signal generated in said signal processing means, to supply the second bias current to the semiconductor laser.

2. A driver circuit according to claim 1, wherein said first bias current supply means includes a temperature compensation section for changing the first bias current corresponding to characteristic changes in the semiconductor laser due to temperature changes.

3. A driver circuit according to claim 2, wherein
   said temperature compensation section has a thermistor with a resistance value which is changed with temperature fluctuations.

4. A driver circuit according to claim 1, further comprising:
   optical output detection means for detecting the power of light output from the semiconductor laser; and
   first bias current control means for feedback controlling an operation of said first bias current supply means so that the optical output power from the semiconductor laser at the time of non-output of data becomes a constant level, based on a detection result of said optical output detection means.

5. A driver circuit according to claim 1, wherein
   said second bias current supply means has a differential amplification type circuit structure.

6. A driver circuit according to claim 1, wherein
said second bias current supply means includes a temperature compensation section for changing the second bias current corresponding to characteristic changes in the semiconductor laser due to temperature changes.

7. A driver circuit according to claim 6, wherein
said temperature compensation section has a thermistor with a resistance value which is changed with temperature fluctuations.

8. A driver circuit according to claim 1, wherein
said signal processing means generates said second bias current control signal which rises more rapidly, by a time corresponding to a predetermined bit number or a predetermined byte number, than the rise of burst data included in said pulse current control signal.

9. A driver circuit according to claim 8, wherein
said signal processing means generates said second bias current control signal which is maintained at a high level over at least a predetermined period of the beginning side of the burst data generation period.

10. A driver circuit according to claim 1, wherein
said first bias current supply means has a circuit structure the same as for said second bias current control means, and generates said first bias current in accordance with a signal obtained by inverting the second bias current control signal generated by said signal processing section.

11. A driver circuit according to claim 1, wherein
when a rise time of the second bias current is shorter than a time corresponding to 1 bit length of burst data,
said signal processing means comprises a delay section for delaying the data signal by a predetermined time, and a logical sum operation section for obtaining a logical sum of an output signal from said delay section and the data signal, and outputs the output signal from said delay section as the pulse current control signal, and outputs an output signal from said logical sum operation section as the second bias current control signal.

12. A driver circuit according to claim 1, wherein
when the rise time of the second bias current is shorter than a time corresponding to 1 bit length of burst data, and also the second bias current is sufficiently larger than the pulse current,
said signal processing section comprises a delay section for delaying the data signal by a predetermined time, and outputs an output signal from said delay section as the pulse current control signal, and outputs the data signal as the second bias current control signal.

13. A method for driving a semiconductor laser in accordance with data signals including data generated in bursts, comprising:
generating, at least at a time of non-output of data, a first bias current for driving the semiconductor laser in a predetermined area within a spontaneous emission area, to supply the first bias current to the semiconductor laser;
generating a pulse current control signal in which the data signal is delayed, using only the data signal, and generating a second bias current control signal that rises more rapidly by a predetermined time than the rise of burst data included in the pulse current control signal;
generating a pulse current in accordance with the pulse current control signal, to supply the pulse current to the semiconductor la; and
generating a second bias current for driving the semiconductor laser in a predetermined area within the spontaneous emission area in accordance with the second bias current control signal, to supply the second bias current to the semiconductor laser.

14. A method for driving a semiconductor laser in accordance with data signals, including data generated in bursts, comprising:
supplying a first bias current for driving the semiconductor laser at least at a time of non-output of data, to drive the semiconductor laser in a spontaneous emission area;
supplying a second bias current to the semiconductor laser prior to data transmission by delaying a data signal; and
supplying a pulse current to the semiconductor laser a predetermined time after commencement of supplying the second bias current.

15. A method for driving a semiconductor laser in accordance with data signals, comprising:
generating data in bursts;
supplying a first bias current for driving the semiconductor laser at least at a time of non-output of data;
supplying a second bias current for driving the semiconductor laser in a predetermined area within a spontaneous emission area in accordance with a second bias current control signal to supply the second bias current to the semiconductor laser; and
supplying a pulse current to the semiconductor laser a predetermined time after commencement of supplying the second bias current.

16. A method for driving a semiconductor laser in accordance with data signals, including data generated in bursts, comprising:
supplying a first bias current for driving the semiconductor laser at least at a time of non-output of data;
supplying a second bias current control signal that rises more rapidly by a predetermined time than the rise of the burst data included in the pulse current control signal;
supplying a second bias current for driving the semiconductor laser in a predetermined area within a spontaneous emission area in accordance with a second bias current control signal to supply the second bias current to the semiconductor laser; and
supplying a pulse current to the semiconductor laser a predetermined time after commencement of supplying the second bias current.

* * * * *

UNITED STATES PATENT AND TRADEMARK OFFICE
CERTIFICATE OF CORRECTION

| | | |
|---|---|---|
| PATENT NO. | : 7,158,551 B2 | Page 1 of 1 |
| APPLICATION NO. | : 10/015616 | |
| DATED | : January 2, 2007 | |
| INVENTOR(S) | : Yuji Tochio | |

It is certified that error appears in the above-identified patent and that said Letters Patent is hereby corrected as shown below:

On the title page:
Column 2 (Abstract), change the entire Abstract to --A driver circuit for a semiconductor laser includes a first bias current supply section supplying, at least at a time of non-output of data, a first bias current to an LD. A signal processing section generates a pulse current control signal in which a burst data signal is delayed, and generates a second bias current control signal which rises more rapidly by a predetermined time than the rise of burst data included in the pulse current control signal. A pulse current supply section supplies to the LD a pulse current generated in accordance with the pulse current control signal. A second bias current supply section supplies to the LD a second bias current generated in accordance with the second bias current control signal.--.

Signed and Sealed this

Eighteenth Day of March, 2008

JON W. DUDAS
*Director of the United States Patent and Trademark Office*